US009583494B2

United States Patent
Hu et al.

(10) Patent No.: US 9,583,494 B2
(45) Date of Patent: Feb. 28, 2017

(54) APPARATUS AND METHOD FOR INTEGRATED CIRCUIT BIT LINE SHARING

(71) Applicant: TAIWAN SEMICONDUCTOR MANUFACTURING COMPANY, LTD., Hsinchu (TW)

(72) Inventors: Yu-Hao Hu, Kaohsiung (TW); Yi-Tzu Chen, Hsinchu (TW); Hao-I Yang, Hsinchu (TW); Cheng-Jen Chang, Taoyuan (TW); Geng-Cing Lin, Taipei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/060,742

(22) Filed: Oct. 23, 2013

(65) Prior Publication Data

US 2015/0109847 A1    Apr. 23, 2015

(51) Int. Cl.
| | |
|---|---|
| *H01L 27/105* | (2006.01) |
| *G11C 7/18* | (2006.01) |
| *G11C 11/412* | (2006.01) |
| *G11C 11/419* | (2006.01) |
| *G11C 5/14* | (2006.01) |
| *G11C 11/4074* | (2006.01) |

(52) U.S. Cl.
CPC ............ *H01L 27/1052* (2013.01); *G11C 7/18* (2013.01); *G11C 11/412* (2013.01); *G11C 11/419* (2013.01); *G11C 5/145* (2013.01); *G11C 5/147* (2013.01); *G11C 11/4074* (2013.01)

(58) Field of Classification Search
CPC ...... G11C 5/147; G11C 5/145; G11C 11/4074
USPC ........................ 365/189.02, 207, 230.05, 190
See application file for complete search history.

(56) References Cited

U.S. PATENT DOCUMENTS

| | | | | |
|---|---|---|---|---|
| 5,276,650 A | * | 1/1994 | Kubota | G11C 7/18 365/189.02 |
| 2015/0055402 A1 | * | 2/2015 | Chen | G11C 7/12 365/156 |

* cited by examiner

*Primary Examiner* — Jason Lappas
(74) *Attorney, Agent, or Firm* — Hauptman Ham, LLP

(57) ABSTRACT

A memory array includes a first memory column having a first bit line, a first word line and a second bit line. The memory array also includes a second memory column having the second bit line, a second word line and a third bit line. The first memory column and the second memory column are configured to share the second bit line. The sharing of the second bit line facilitates sharing one or more memory array components between the first memory column and the second memory column.

20 Claims, 9 Drawing Sheets

APPARATUS AND METHOD FOR INTEGRATED CIRCUIT BIT LINE SHARING

BACKGROUND

Device manufacturers are continually challenged to reduce the size of various integrated circuits and semiconductor devices while increasing processing speeds and reducing power consumption.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

Figure 1:
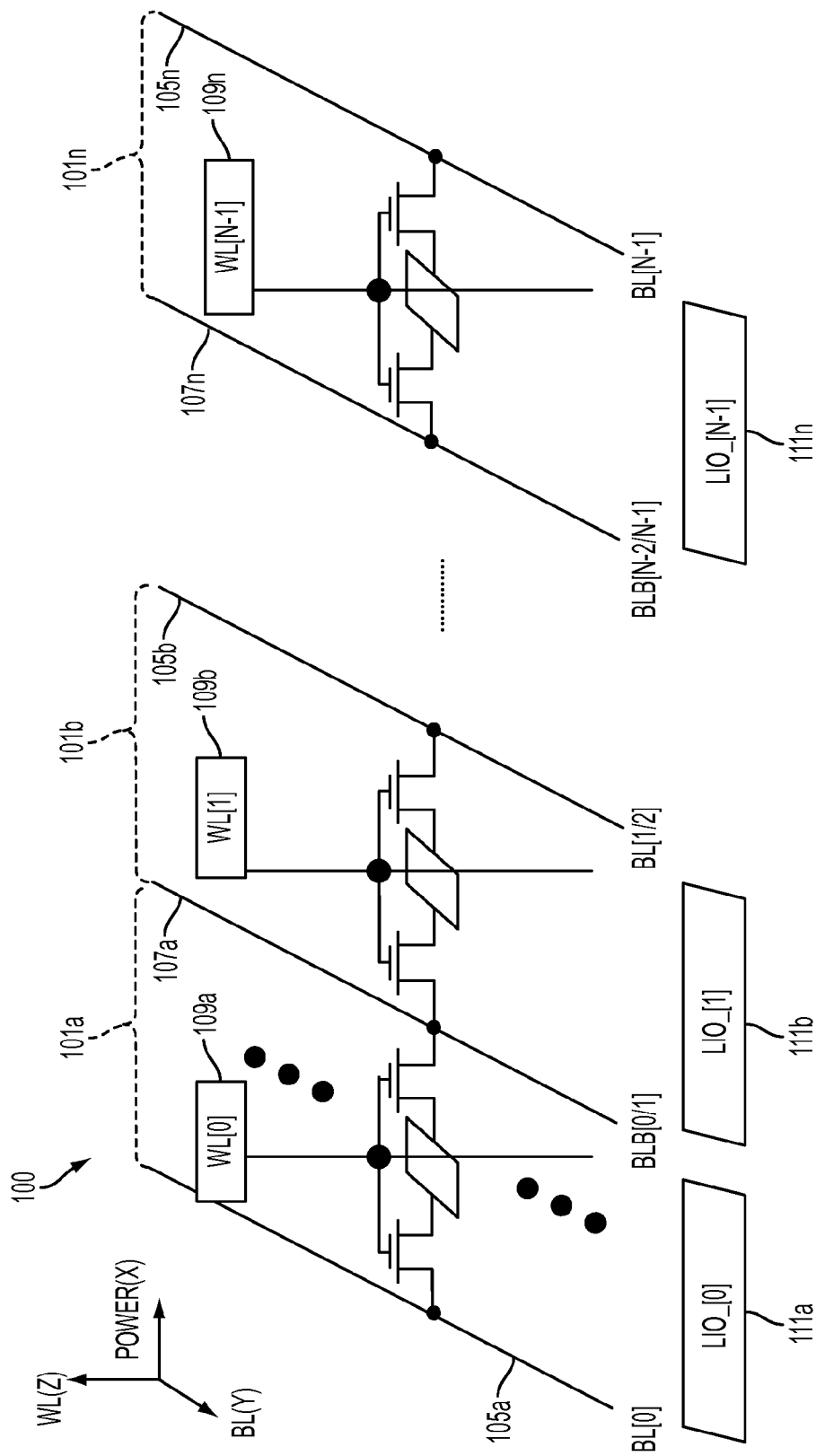
FIG. 1 is a diagram of a memory array, in accordance with one or more example embodiments.

The following disclosure provides many different embodiments, or examples, for implementing different features of the invention. Specific examples of components and arrangements are described below to simplify the present disclosure. These are examples and are not intended to be limiting.

Device manufacturers are continually challenged to reduce the size of various integrated circuits and semiconductor devices such as, for example, memory arrays despite the overarching demand to increase processing speeds while reducing power consumption of such devices.

Some memory arrays include a two-dimensional structure in which a plurality of neighboring memory columns individually include bit line and bit line bar pairs in communication with one or more word lines that span the plurality of memory columns. In other words, there are two times the number of bit lines and bit line bars as there are memory columns in a two-dimensional memory array that have one or more word lines spanning a plurality of memory columns.

Some two-dimensional structures also include a spacing compliant with particular design rules, e.g., Design Rule Check ("DRC") spacing, between the plurality of memory columns to ensure that the memory columns work properly. Such spacing increases the overall peripheral or layout size of a memory array as more and more memory columns are included. The spacing between memory columns in these two-dimensional structures also reduces speed capabilities of a particular memory array because of, for example, the distance between the memory columns.

Bit lines are often associated with bit line switches that facilitate a bit line to be any of Read-selected/Write-selected/Not-selected. There are often two times the number of bit line switches as there are memory columns in two-dimensional memory arrays. Such bit line switches increase power consumption and reduce processing speeds. Additionally, the inclusion of peripheral circuits such as bit line switches, numerous word lines that span the plurality of memory columns, numerous local input/output ("LIO") precharge P-type metal-oxide semiconductor ("PMOS") circuits, LIO Y-pass-gate (read/write) metal-oxide semiconductor ("MOS") circuits, and the like result in a peripheral area of a memory array that is greater than a minimum possible peripheral area that might otherwise be achievable but for the presence of such peripheral circuitry.

For example, some two-dimensional memory arrays include a number of LIO Pre-charge-PMOS and Read/Write-pass-gate circuits associated with each bit line and bit line bar pair that spans across the two-dimensional memory array equal to two times the number of memory columns included in the two-dimensional memory array. Similarly, there are two times the number of LIO Y-pass-gate (Read/Write-pass-gate) MOS circuits as there are LIO's.

Two-dimensional memory arrays are not readily adaptable to share or merge a bit line and a neighboring bit line bar to eliminate the spacing between memory columns. The spacing cannot be eliminated because the neighboring memory columns will conflict with one another when a word line is activated. The parasitic coupling capacitance between two active bit-lines creates undesirable signal noise, reduces processing speed capabilities and increases power consumption.

FIG. 1 is a diagram of a memory array 100 according to one or more example embodiments. The memory array 100 has a shared bit line structure for a MUX N (Bit-interleave N) application. In some embodiments, the memory array 100 is configured to provide a memory circuit that occupies a minimal amount of spacing, whether such spacing is in a peripheral sense (e.g. two-dimensional occupied space) or overall three-dimensional spacing. In some embodiments, the memory array 100 also increases processing speeds and reduces power consumption when compared to some two-dimensional memory arrays.

The memory array 100 includes N memory columns 101a-101n (hereinafter collectively referred to as memory column(s) 101 where appropriate).

The memory array 100 also includes a series of bit lines ("BL") 105a-105n (hereinafter collectively referred to as BL 105 where appropriate) and bit line bars ("BLB") 107a-107n (hereinafter collectively referred to as BLB 107 where appropriate). In some embodiments, the sequence of BL's and BLB's as illustrated are readily swapped to change the order of BL's with respect to BLB's while maintaining the alternating sequence of BL's to BLB's. Accordingly, when referring generally to a "bit line" such reference refers to either a BL or a BLB depending on the embodiment. As such, in some embodiments, the memory array 100 includes N+1 bit lines.

The memory array 100 additionally includes N word lines ("WL") 109a-109n (hereinafter collectively referred to as WL 109 where appropriate). The memory array 100 further includes local input/outputs ("LIO") 111a-111n (hereinafter collectively referred to as LIO 111 where appropriate).

Memory column 101a is associated with BL 105a, bit line bar ("BLB") BLB 107a, WL 109a, and LIO 111a. Memory column 101b is associated with the BLB 107a, BL 105b, WL 109b, and LIO 111b. Memory column 101n is associated with BLB 107n, BL 105n, WL 109n, and LIO 111n. The memory array 100, in other words, includes any quantity of memory columns 101, bit lines 105, bit lines bars 107, word lines 109 and LIO's 111 such that the population of memory columns 101=N, bit lines 105/107=N+1, and word lines 109=N. The number of LIO's 111 included in the memory array 100 is any quantity of LIO's 111. In some embodiments, the memory array 100 includes N LIO's 111, N+1 LIO's 111, etc.

In some embodiments, the memory column 101a and memory column 101b are adjacent. Memory column 101a and memory column 101b share BLB 107a, for example, based on a switching between a logic pass [0] and a logic pass [1]. Sharing BLB 107a between logic passes [0/1] makes it possible to eliminate spacing between the memory column 101a and memory column 101b, thereby reducing the size of the memory array 100 toward a minimum overall size and increasing processing speeds when compared to some two-dimensional memory arrays having significant spacing. Additionally, sharing BLB 107a between memory column 101a and memory column 101b makes it possible to reduce the quantity of "bit line switches," or LIO per-charge PMOS circuits, included in a memory array, such as memory array 100, thereby conserving space. Because there are fewer bit line switches in the memory array, in some embodiments, power consumption is reduced compared to some two-dimensional memory array structures having more bit line switches.

In some embodiments, WL's 109 are configured to be formed such that the WL's 109 are substantially orthogonal to the BL's 105 and BLB's 107. For example, in some embodiments, BL's 105 and BLB's 107 are in a same plane. WL's 109, accordingly, are substantially orthogonal to the plane that includes the BL's 105 and the BLB's 107. In some embodiments, WL's 109 are part of a continuous inter-leaved WL 109 that winds through memory columns 101 in a manner that facilitates sharing bit lines such as portions of the continuous inter-leaved WL 109 being substantially orthogonal to the BL's 105 and BLB's 107.

In some embodiments, the memory columns 101 are associated with WL's 109 to facilitate sharing neighboring BL's 105 and/or BLB's 107. Bit-interleaving such as the discussed sharing of BL's 105 and/or BLB's 107 paired with having WL's 109 that are associated with memory columns 101 in the manner described eliminates the coupling effect discussed above. In some embodiments, the bit line sharing makes it possible to reduce power consumption and/or increase processing speed capabilities of the memory array 100.

In some embodiments, the memory array 100, BL's 105, BLB's 107, WL's 109, and LIO's 111 comprise one or more conductive materials implanted or otherwise formed as one or more layers in or on a semiconductor substrate so that the conductive materials or layers are routed for the corresponding line or LIO, for example. In other embodiments, the memory array 100, BL's 105, BLB's 107, WL's 109, and LIO's 111 comprise individual modules assembled on one or more semiconductor substrates.

For ease of understanding, some of the figures include an XYZ axis to generally illustrate the directional relationships described regarding one or more example embodiments.

Figure 2:
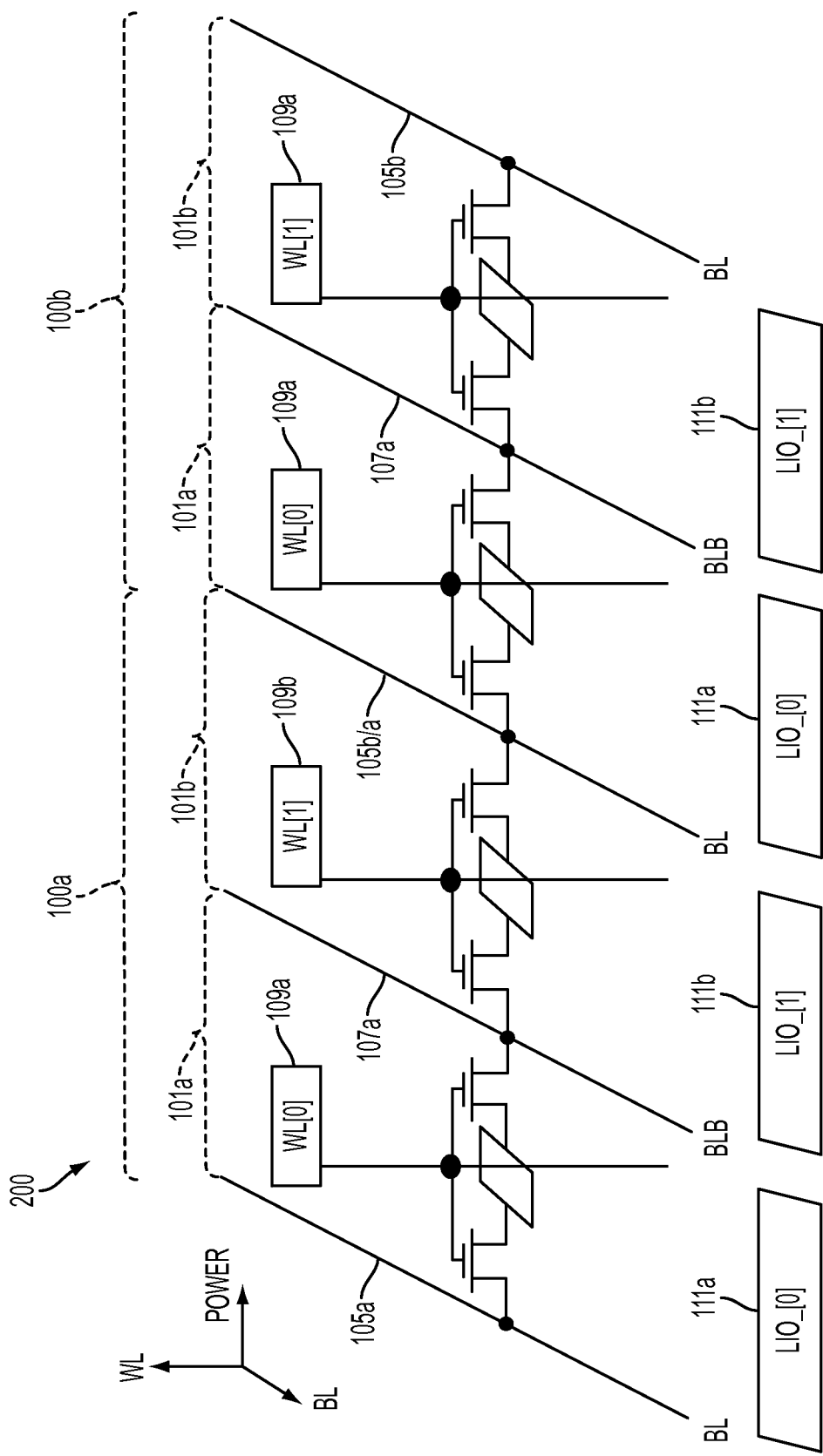
FIG. 2 is a diagram of the memory array configured to illustrate bit line sharing for a MUX 2 (Bit-interleave-2) structure, in accordance with one or more example embodiments.

FIG. 2 is a diagram of the memory array 200 configured to illustrate a shared BL for a MUX 2 N (Bit-interleave-2) structure, according to one or more example embodiments. In some embodiments, a shared BL is also applicable when joining separate memory arrays such as multiple memory arrays 100, discussed above. In this example, the memory array 200 is configured to have two memory arrays 100 that each have two memory columns 101 (i.e., N=2). As such, the memory array 200 includes a first memory array 100a similar to memory array 100 discussed above and a second memory array 100b also similar to memory array 100 discussed above.

Memory array 200 is configured such that memory array 100a and memory array 100b share BL 105b/a that is illustrated to be the end BL for memory array 100a and the end BL for memory array 100b.

Figure 3:
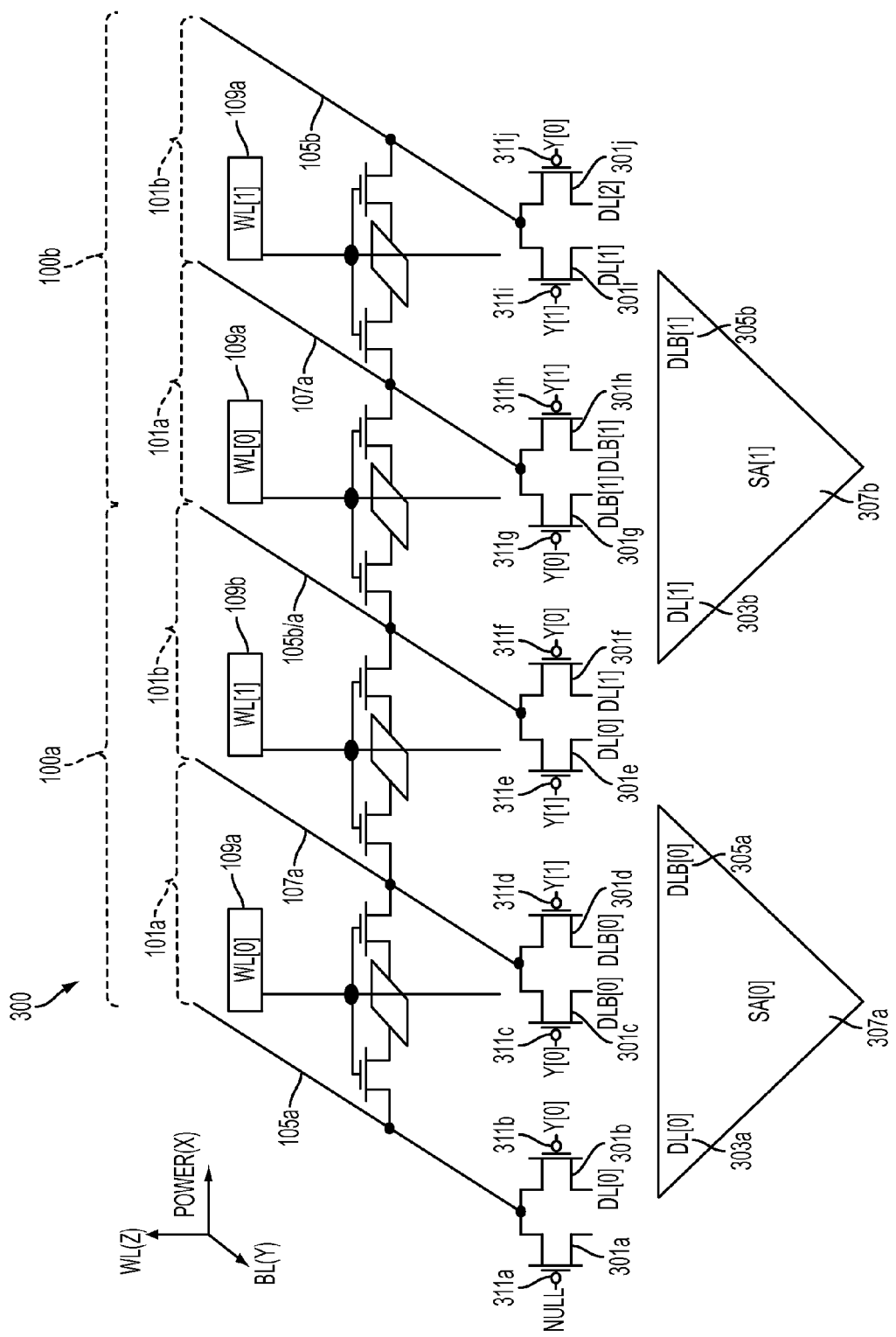
FIG. 3 is a diagram of a memory array configured to illustrate a boundary example of a YMUX 2 application of a shared bit line structure, in accordance with one or more example embodiments.

FIG. 3 is a diagram of a memory array 300 configured to illustrate a boundary example of a YMUX 2 application of a shared bit line structure, such as those discussed above, according to an example embodiment. In this example, the memory array 300 is configured similarly to memory array 200 discussed above to have two memory arrays 100 that have two memory columns 101. Accordingly, memory array 300, like memory array 200, is an example of a combination of two N=2 memory column structures. The BL's 105 and BLB's 107 are associated with BL switches 301a-301j (hereinafter collectively referred to as BL switch 301 where appropriate) within memory arrays 100a and 100b.

Memory array 300 is in communication with data line ("DL") 303a, DL 303b, data line bar ("DLB") 305a and DLB 305b. DL 303a and DLB 305a are associated with a sense amplifier ("SA") 307a. DL 303b and DLB 305b are associated with a SA 307b. BL switch 301a is null. BL switch 301b is in communication with DL 303a, BL switch 301c is in communication with DLB 305a, BL switch 301d is in communication with DLB 305a, BL switch 301e is in communication with DL 303a, BL switch 301f is in communication with DL 303b, BL switch 301g is in communication with DLB 305b, BL switch 301h is in communication with DLB 305b, BL switch 301i is in communication with DL 303b and BL switch 301j is in communication with another DL [not shown]. BL switch 301j, for example, is associated with another memory column or memory array (not shown) or part of a BL switch pair at the boundary of memory array 300.

In this example embodiment, BL switch 301a is null and BL switch 301j is in communication with another DL. As such, each of the memory arrays 100a and 100b have 2*N BL switches 301 (i.e., memory array 100a has four BL switches 301 and memory array 100b has four BL switches 301). The memory array 300, therefore, includes eight BL switches 301 in communication with two SA's 307.

Such arrangement, as discussed above, results in a space occupied by the memory array 300 to be driven toward a minimum, power consumption to be driven toward a minimum and processing speed capabilities of the memory array 300 to be driven toward a maximum while still accommodating a minimal amount circuitry to achieve the example embodiment. In addition to reduced space occupancy, power consumption and increased processing speeds, the reduction in features compared to some two-dimensional memory array structures also reduces the overall complexity of the memory array 300 thereby improving reliability and/or manufacturability as well.

According to this example embodiment, memory array 300 is also in communication with Y-directional decoder output ("YDEC") signals 311*a*-311*j* (hereinafter collectively referred to as YDEC signal 311). YDEC signals 311 are associated with one of a logic pass [0] and a logic pass [1]. The number of YDEC signals 311 for logic pass [0] is N YDEC signals 311. The number of YDEC signals 311 for logic pass [1] is N YDEC signals 311. In total, there is an equivalent number of YDEC signals 311 to the number of BL switches 301, or 2*N YDEC signals 311. In some embodiments, the total gate loading of all YDEC-signals is 2N*(Number of SA/IO).

Figure 4:
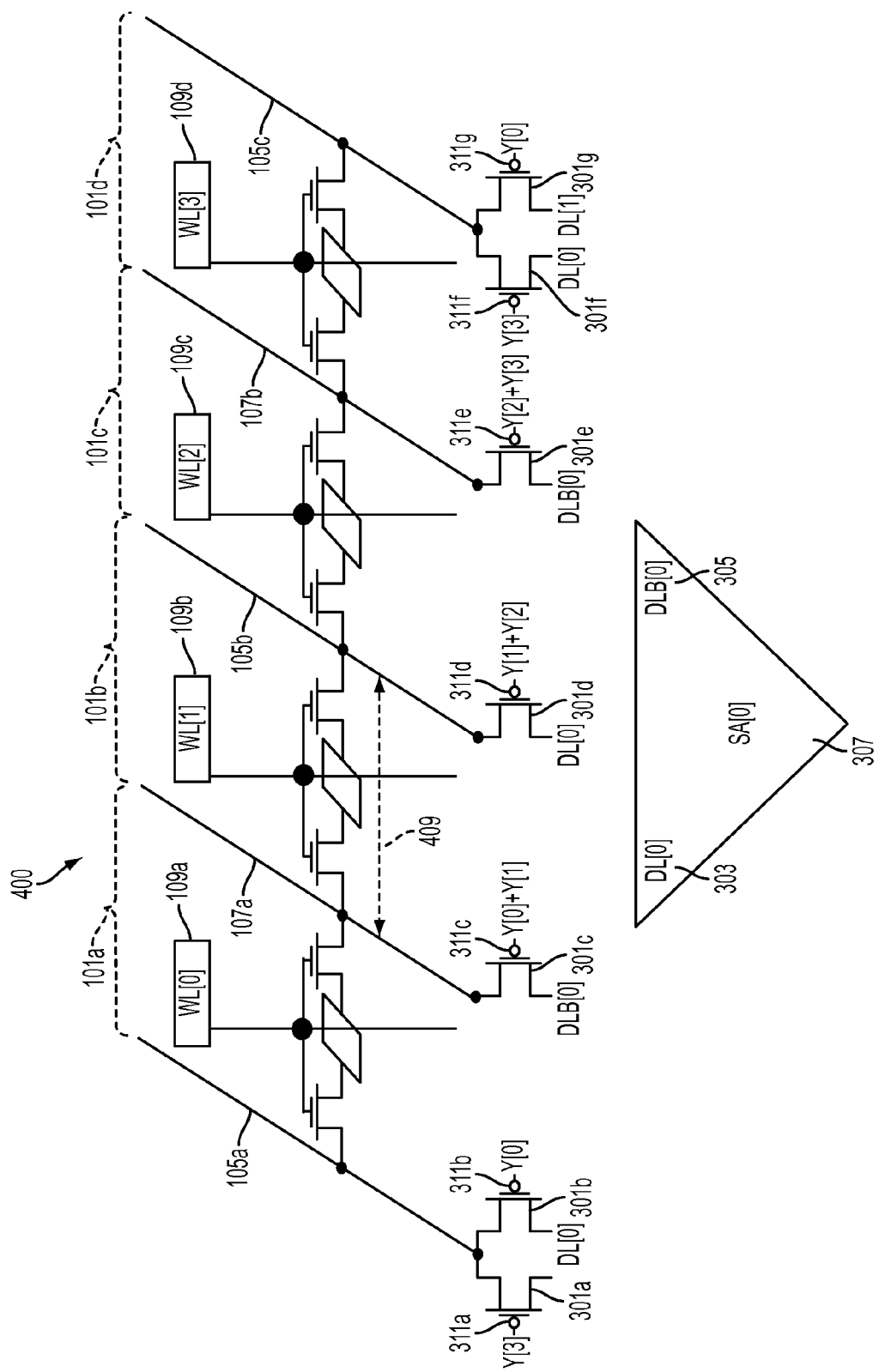
FIG. 4 is a diagram of a memory array configured to illustrate bit line sharing for a YDEC design for MUX 4 application, which has a shared Read-Pass-Gate, in accordance with one or more example embodiments.

FIG. 4 is a diagram of a memory array 400 configured to illustrate the discussed bit line sharing for a YDEC design for MUX 4, according to an example embodiment. In this example, the memory array 400 is configured similarly to memory array 100 for an N=4 memory column structure. Accordingly, memory array 400 has N=4 memory columns 101 and N=4 WL's 109. The BL's 105 and BLB's 107 are associated with BL switches 301*a*-301*g* totaling N+1 bit lines.

Memory array 400 is in communication with DL 303, DLB 305. DL 303 and DLB 305 are associated with a SA 307. BL switch 301*a* is null. BL switch 301*b* is in communication with DL 303, BL switch 301*c* is in communication with DLB 305, BL switch 301*d* is in communication with DL 303, BL switch 301*e* is in communication with DLB 305, BL switch 301*f* is in communication with DL 303, and BL switch 301*g* is in communication another DL [not shown]. BL switch 301*g*, for example, is associated with another memory column or memory array [not shown], or is formed as part of a BL switch pair at the boundary of the memory array 400.

In this example embodiment, BL switch 301*a* is null and BL switch 301*g* is in communication with another DL. As such, the memory array 400 has N+1 BL switches 301. The memory array 400, therefore, includes five BL switches 301 in communication with one SA 307.

Memory array 400 has a column pitch 409 (i.e. a spacing between memory column 101*a* and memory column 101*c* that is equal to the width of memory column 101*b* between them). In other words, there is no additional metal spacing regulated by DRC between neighboring memory columns 101. Such arrangement, as discussed above, results in a space occupied by the memory array 400 to be driven toward a minimum, while increasing processing speed capabilities of the memory array 400 toward a maximum. Further, because certain BL's 105 and BLB's 107 are configured to share some of the BL switches 301, BL switch 301 or pre-charge power consumption is reduced toward a minimum power consumption. Such accomplishments are done while still accommodating a minimal amount circuitry to achieve the example embodiment.

According to this example embodiment, memory array 400 is also in communication with YDEC signals 311*a*-311*g*. There is an equivalent number of YDEC signals 311 to the number of BL switches 301. In other words, there are N+1 YDEC signals 311 and N+1 switches per LIO in a mux-N design (i.e. five YDEC signals 311*b*-311*f* for a MUX-4 design). The YDEC signals 311 are increased to be N+1, (i.e., logic passes [0], [0]+[1], [1]+[2], [2]+[3], and [3]) but actually are reduced in overall wire loading (N+1)*(number of SA/IO) compared to the memory array 300 discussed above and compared to some two-dimensional memory arrays. Accordingly, the overall reduction in YDEC signals 311 compared to memory array 300 and to some two-dimensional memory arrays not only reduces space occupied by the memory array 400, reduces power consumed by the memory array 400 and increases processing speed capabilities of the memory array 400, but also reduces the number of features included in the memory array 400 toward a minimum, thereby reducing the overall complexity of the memory array 400 and improving reliability and manufacturability as well.

Figure 5:
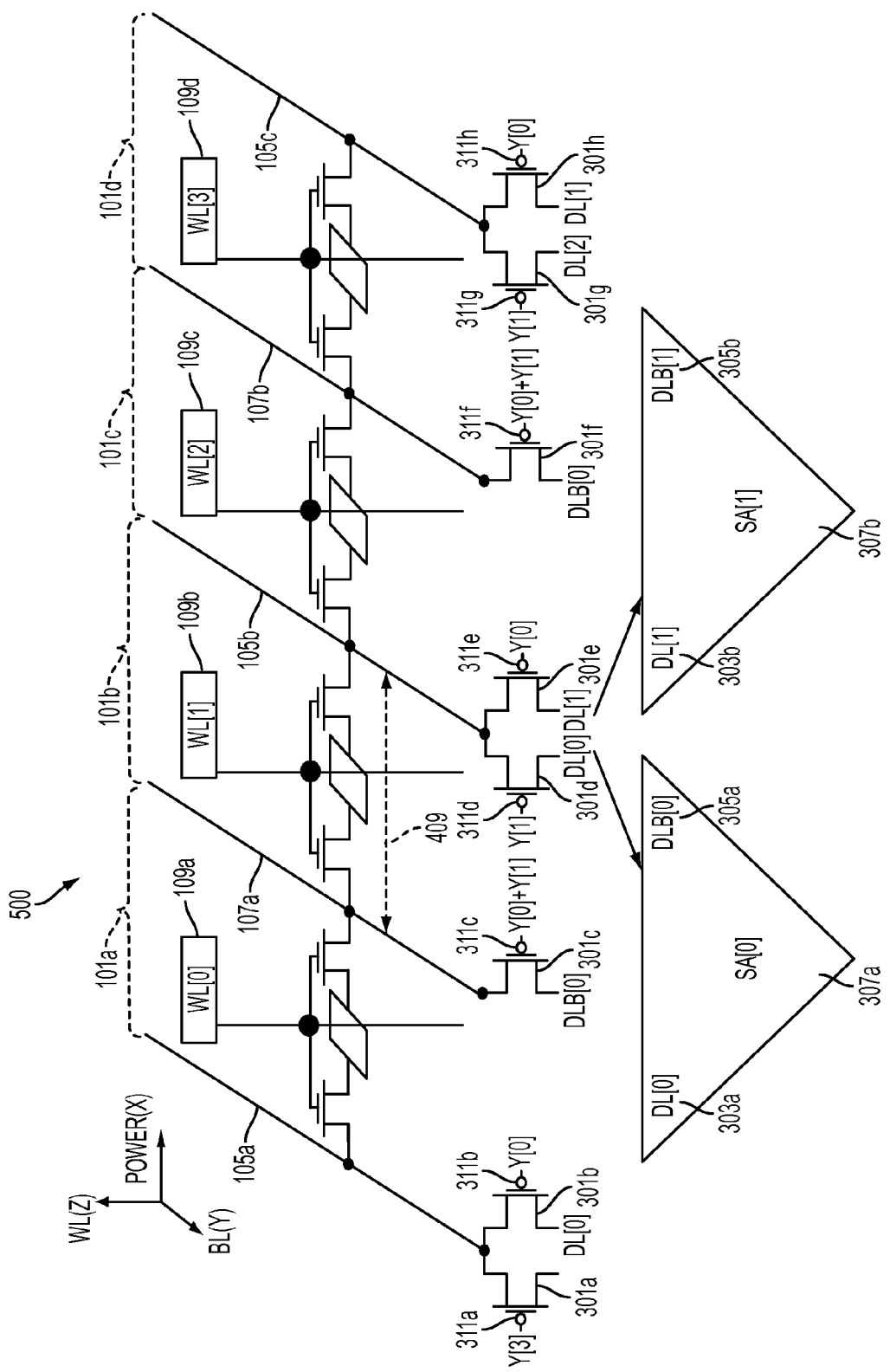
FIG. 5 is a diagram of a memory array configured to illustrate bit line sharing for a YDEC design for MUX 2 application, which has a shared Read-Pass-Gate, in accordance with one or more example embodiments.

FIG. 5 is a diagram of a memory array 500 configured to illustrate the discussed bit line sharing for a YDEC design for MUX 2, according to an example embodiment. In this example, the memory array 400 is configured similarly to memory array 100 for an N=4 memory column structure. Accordingly, memory array 400 has four memory columns 101. The memory array 500 is similar to the memory array 400, discussed above, but is configured to accommodate two SA's 307 like memory array 300 discussed above with respect to FIG. 3. BL's 105 and BLB's 107 are associated with BL switches 301*a*-301*h* to accommodate the communication with SA 307*a* and SA 307*b*.

Memory array 500 is in communication with DL 303*a*, DL 303*b*, DLB 305*a* and DLB 305*b*. DL 303*a* and DLB 305*a* are associated with SA 307*a*. DL 303*b* and DLB 305*b* are associated with a SA 307*b*. BL switch 301*a* is null. BL switch 301*b* is in communication with DL 303*a*, BL switch 301*c* is in communication with DLB 305*a*, BL switch 301*d* is in communication with DL 303*a*, BL switch 301*e* is in communication with DL 303*b*, BL switch 301*f* is in communication with DLB 305*a*, BL switch 301*g* is in communication with DL 303*a*, BL switch 301*h* is in communication with DL 303*b*.

In this MUX 2 example embodiment, BL switch 301*a* is null and BL switch 311*h* is in communication with DL[2] 303 (not shown). Accordingly, to accommodate SA 307*a* and SA 307*b* with a minimal number of BL switches, the memory array 500 includes 2+1 BL switches 301 or N+1 BL switches 301 per LIO (per SA 307).

The memory array 500 has a column pitch 409 (i.e., a spacing between memory column 101*a* and memory column 101*c* that is equal to the width of memory column 101*b* between them). In other words, there is no additional metal spacing regulated by DRC between neighboring memory columns 101. Such an arrangement, as discussed above, results in a space occupied by the memory array 500 to be driven toward a minimum and processing speed capabilities of the memory array 500 to be driven toward a maximum while still accommodating a minimal circuitry to achieve the example embodiment.

According to this example embodiment, memory array 500 is also in communication with YDEC signals. The number of YDEC-signals is 2+1 (i.e., [0], [0]+[1], and [1]). The total gate-loading of YDEC-signal=(2+1)*(number of SA/IO), or N=2. Accordingly, the overall reduction in YDEC signals 311 compared to memory array 300, and to some two-dimensional memory array, not only reduces space occupied by the memory array 500, reduces power consumed by the memory array 500 and increases processing speed capabilities of the memory array 500, but also reduces the number of features included in the memory array 500 toward a minimum, thereby reducing the overall complexity of the memory array 500 and improving reliability and manufacturability as well.

Figure 6:
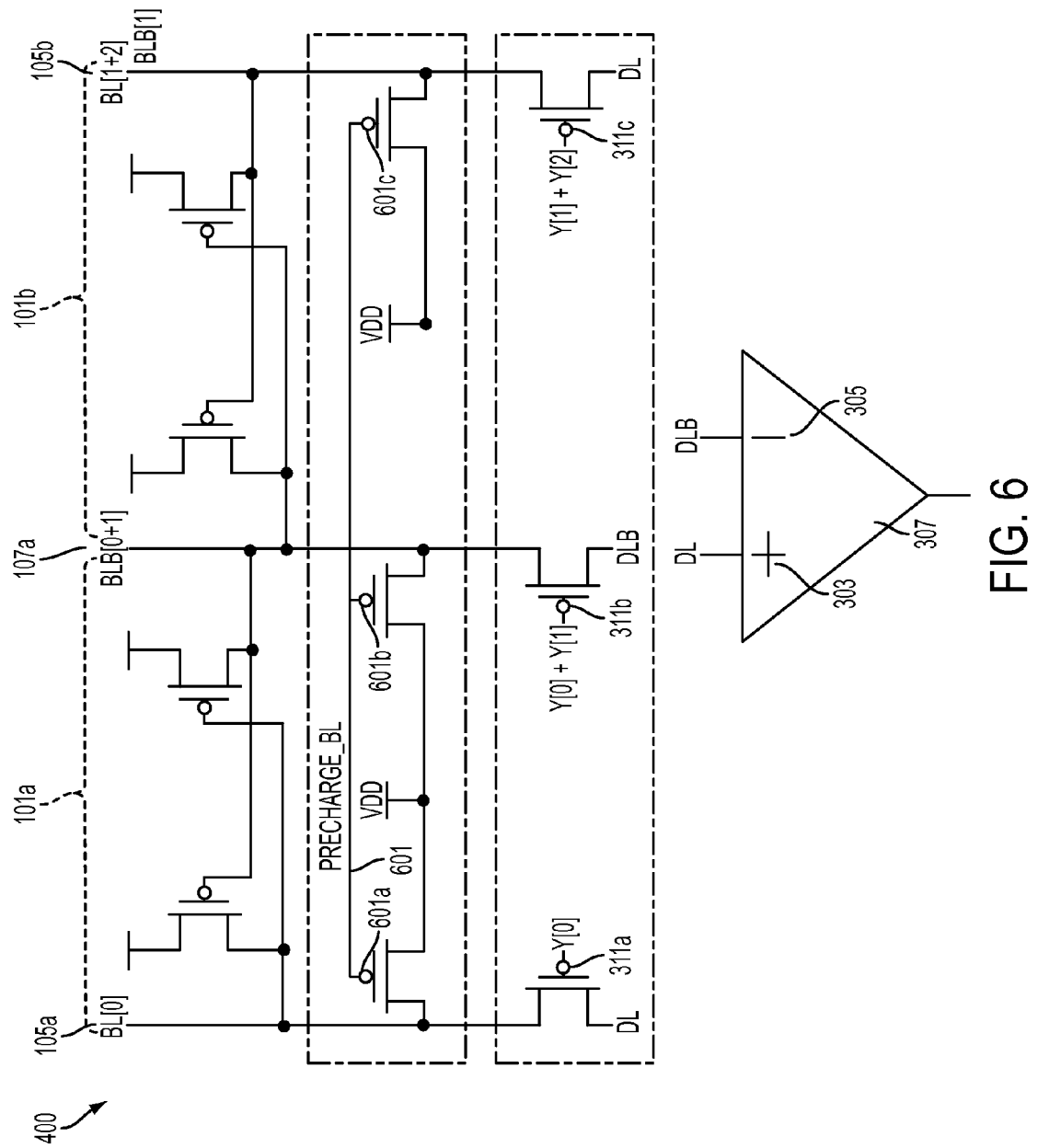
FIG. 6 is a close-up view of a portion of the memory array illustrated in FIG. 4, in accordance with one or more example embodiments.

FIG. 6 is a close-up view of a portion of memory array 400, discussed above. The illustrated portion of memory array 400 demonstrates a shared BL pre-charge and YDEC_READ, according to an example embodiment.

A BL pre-charge line, in this example, has three BL pre-charge nodes, 601a, 601b and 601c (hereinafter collectively referred to as BL pre-charge node 601 where appropriate). The BL pre-charge nodes 601 are configured to receive a signal from a processor or controller such as memory controller 805, discussed below, to provide pre-charge power to the memory array 400. In this example, there are three BL pre-charge nodes 601, or in other words N+1 BL pre-charge nodes 601. In this example, BLB 107a is shared between memory column 101a and memory column 101b, and BL pre-charge node 601b is shared between memory columns 101a and 101b, for example. Similarly, with BL 105b is one of shared with a next memory column 101, such as memory column 101c discussed above, or not shared with any next memory column 101 if BL 105b is at the boundary of a memory array, for example. BL pre-charge node 601c, accordingly, depending on embodiment, is shared to pre-charge BL 105b, for example.

This sharing of pre-charge nodes 601 reduces power consumption by the memory array 400 during pre-charge of the BL's 105 and BLB's 107, as well as space consumed by the memory array 400 compared to a two-dimensional memory array that includes BL-pre-charge nodes having an equal quantity to the quantity of BL's and BLB's included in the two-dimensional memory array.

YDEC's 311a, 311b and 311c are associated with BL 105a, BLB 107a and BL 105b. In this example, there are three YDEC's 311, or in other words N+1 YDEC's 311. With BLB 107a being shared between memory column 101a and memory column 101b, YDEC 311b is also shared. Similarly, with BL 105b being shared in memory array 400, YDEC 311c is also shared. In some embodiments, such as those in which a memory array does not have a next memory column 101, the YDEC 311c, or any other YDEC at the boundary of such a memory column, is not shared.

This sharing of YDEC's 311 reduces power consumption, increases processing speed capabilities, reduces space occupied by the memory array 400 and reduces the complexity of the memory array 400 compared to a two-dimensional memory array that includes YDEC's populated to a quantity equal to a quantity of BL's and BLB's included in the two-dimensional memory array.

Figure 7:
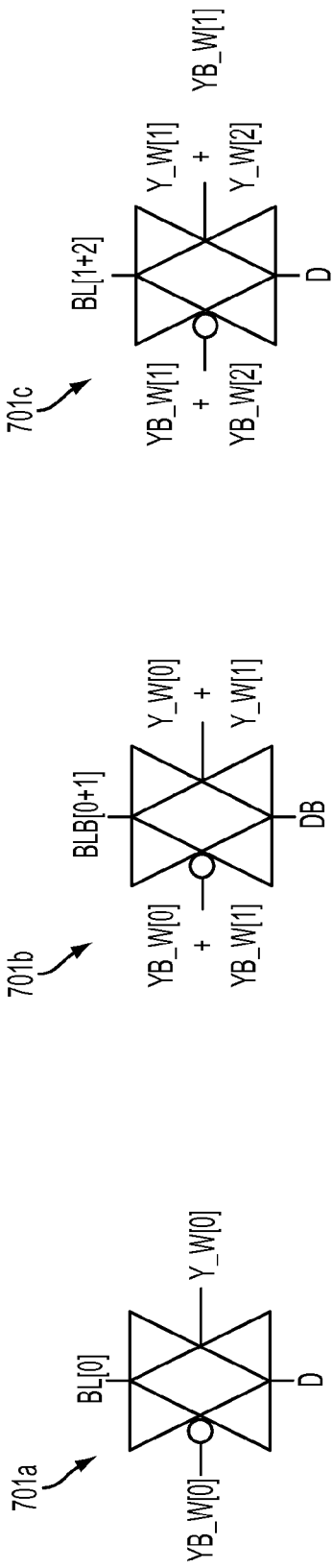
FIG. 7 is a diagram illustrating Write-Pass-Gates associated with a memory array having N=2 memory columns, which has a shared Write-Pass-Gate, in accordance with one or more example embodiments.

FIG. 7 is a diagram illustrating Write-Pass-Gates associated with a memory array as discussed above having N=2 memory columns, according to an example embodiment. For a memory array having N=2 memory columns 101, such as those discussed above, the number of write-pass-gates in such a circuit would be three, or in other words N+1. Compared to a two-dimensional memory array that includes 2*N write-pass-gates per LIO 111, the memory arrays discussed above make it possible to configure the memory array to include write-pass-gate 701a, write-pass-gate 701b and write-pass-gate 701c (hereinafter collectively referred to as write-pass-gate 701 where appropriate) for a memory array having 2=N memory columns 101. In some embodiments, however, any quantity of write-pass-gates 701 are included in the memory array.

Such a reduction in quantity of write-pass-gates 701 from that of a two-dimensional memory array reduces the complexity of, reduces power consumption by, and reduces space occupied by, a memory array while increasing processing speed potential of the memory array when compared to a two-dimensional memory array such as that discussed above.

Figure 8:
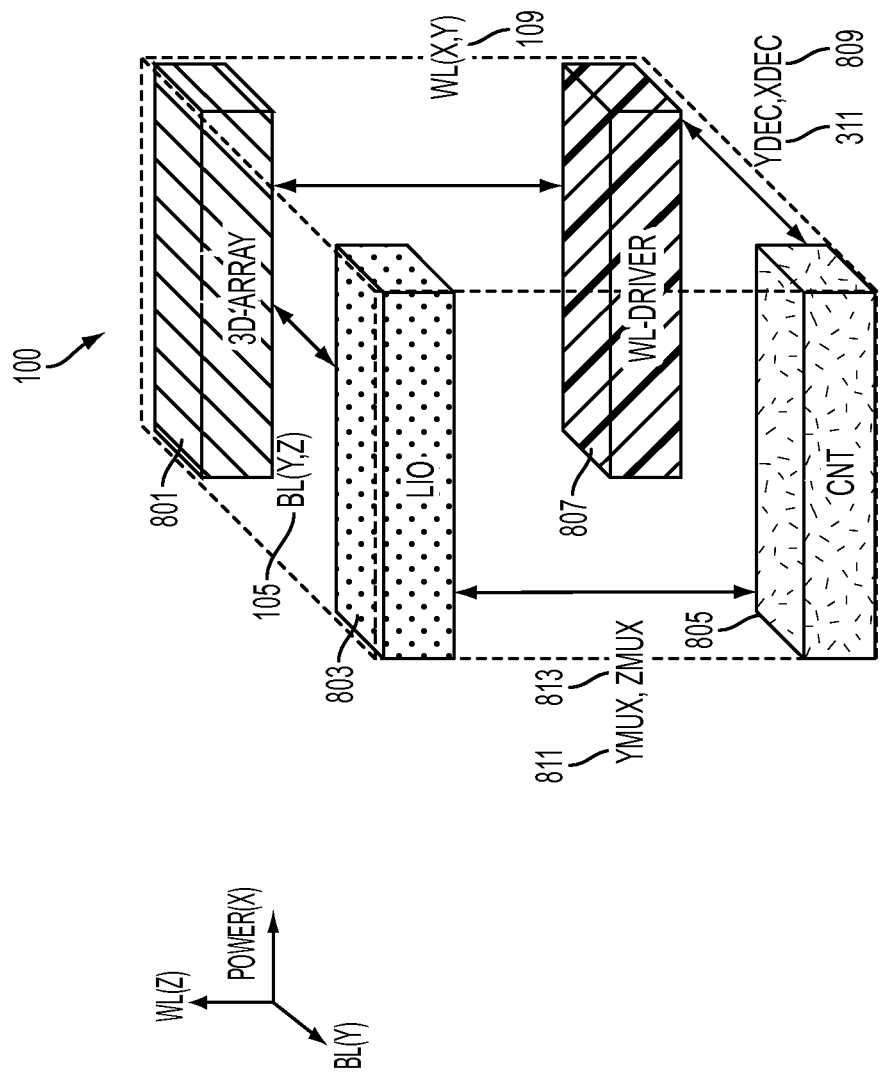
FIG. 8 is an isometric view of a memory array, in accordance with one or more example embodiments.

FIG. 8 is an isometric view of memory array such as memory array 100 discussed above, according to an example embodiment. The memory array 100 includes a 3D-array 801, a LIO 803, a controller 805 and a word line driver ("WL-driver") 807. In this example, the 3D-array 801 is in direct communication with the LIO 803 and the WL-driver 807. In other embodiments, the 3D-array is in communication with the LIO 803 and/or the WL-driver 807 indirectly by way of an intermediary component of the memory array. The 3D-array 801 is in communication with the controller 805 by way of the LIO 803 and/or the WL-driver 807. In other embodiments, the 3D-array 801 is in direct communication with the controller 805. The LIO 803 and the WL-driver 807 are in direct communication with the controller 805. In other embodiments, like the 3D-array, the LIO 803 and/or the WL-driver 807 are in communication with the controller 805 indirectly by way of at least one intermediary component of the memory array.

The 3D-array 801 is configured to include one or more memory columns 101, discussed above. BL 105 is illustrated as running between the LIO 803 and the 3D-array 801. WL 109 is illustrated as running between the WL-driver 807 and the 3D-array 801 in a direction orthogonal to that of the BL 105. YDEC 311 and XDEC 809 are illustrated as running between the controller 805 and the WL-driver 807. YMUX 811 and ZMUX 813 are illustrated as running between the LIO 803 and the controller 805.

The LIO 803, in some embodiments, is a single LIO that is configured to facilitate communications to the 3D-array 801 as a whole. In other embodiments, the LIO 803 includes any number of LIO's 803 configured to be in communication with one or more of the memory columns 101 included in the 3D-array 101. For example, in other embodiments, LIO 803 includes a number of LIO's 803 equal to the number of memory columns 101 in the 3D array. In other embodiments, LIO 803 includes lesser number of LIO's than the number of memory columns included in 3D-array 803. In yet another embodiment, LIO 803 includes a greater number of LIO's than the number of memory columns 101 included in the 3D-array 801.

Figure 9:
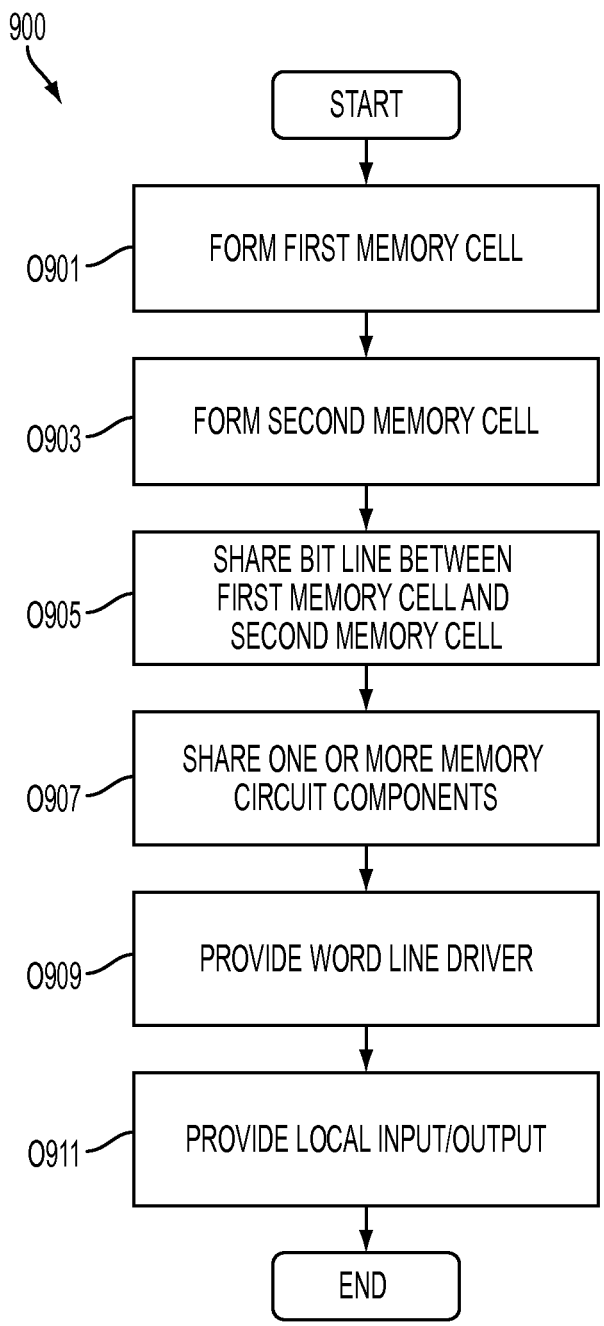
FIG. 9 is a flowchart of a process for forming a memory array, in accordance with one or more example embodiments.

FIG. 9 is a flowchart of a process 900 for forming a memory array according to one or more example embodiments. The process begins with operation O901 in which a first memory column is formed, the first memory column including a first bit line, a first word line, and a second bit line. In some embodiments, the first word line is substantially orthogonal to the first word line and the second word line.

Then, in operation O903, a second memory column is formed, the second memory column including the second bit line, a second word line, and a third bit line. In some embodiments, the second word line is substantially orthogonal to the second bit line and the third bit line. According to various embodiments, the first memory column and the second memory column are configured to be a three-dimensional array. In other embodiments, the first memory column, the second memory column and a third memory column are formed to have a column pitch between the first memory column and the third memory column that is equal to the width of the second memory column.

Next, in operation O905, the second bit line is shared between the first memory column and the second memory column.

The process continues to operation O907 in which one or more memory array components are shared between the first memory column and the second memory column. The memory array components comprise, for example, any of a bit line switch, a BL pre-charge node, or a YDEC, or other suitable component.

Then, in operation O909, a word line driver is provided such that the word line driver is in direct communication with the one or more of the first word line, the second word line, and a three-dimensional array that includes one or more of the first word line and the second word line.

Next, in operation O911, a local input/output is provided in direct communication with one or more of the first bit line, first word line, the second bit line, the second word line, and a three-dimensional array that includes one or more of the first bit line, the first word line, the second bit line and the second word line.

One aspect of this description relates to a memory array that includes a first memory column having a first bit line, a first word line and a second bit line. The memory array also includes a second memory column having the second bit line, a second word line and a third bit line. The first memory column and the second memory column are configured to share the second bit line. The shared third bit line facilitates sharing of one or more other memory array components between the second memory column and the third memory column, and the shared fourth bit line facilitates sharing of one or more additional memory array components between the third memory column and the fourth memory column.

Another aspect of this description relates to a memory array that includes a first conductive layer being routed to define a first bit line, a second bit line and a third bit line. The memory array also includes a first memory column having a portion of the first conductive layer, the first bit line, the second bit line a first word line configured to be in contact with the first bit line and the second bit line. The memory array further includes a second memory column having another portion of the first conductive layer, the second bit line, the third bit line and a second word line configured to be in contact with the second bit line and the third bit line. The first memory column and the second memory column are configured to share the second bit line and the shared second bit line facilitates sharing of one or more memory array components between the first memory column and the second memory column.

Still another aspect of this description relates to a method for forming a memory array, the method including forming a first memory column having a first bit line, a first word line and a second bit line. The method also including forming a second memory column having the second bit line, a second word line and a third bit line. The method additionally including sharing the second bit line between the first memory column and the second memory column. The method further includes sharing one or more memory array components between the first memory column and the second memory column.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A memory array comprising:
    a first memory column comprising:
        a first bit line;
        a first word line; and
        a second bit line; and
    a second memory column comprising:
        the second bit line;
        a second word line; and
        a third bit line,
    wherein,
    the first memory column and the second memory column are configured to share the second bit line and the shared second bit line facilitates sharing of one or more memory array components between the first memory column and the second memory column, and
    the first bit line and the second bit line are in a first plane, at least a portion of a continuous path of the first word line and at least a portion of a continuous path of the second word line are in a second plane, and the second plane intersects the first plane.

2. The memory array of claim 1, wherein the second plane is substantially orthogonal to the first plane.

3. The memory array of claim 2, wherein the first word line and the second word line are substantially orthogonal to the first plane.

4. The memory array of claim 1, wherein a column pitch between the first memory column and a third memory column is equal to a width of the second memory column.

5. The memory array of claim 1, wherein the first memory column and the second memory column are configured to be arranged in a three dimensional array.

6. The memory array of claim 1, wherein the one or more memory array components comprise one or more of a bit line switch, a bit line pre-charge node and a Y-directional decoder output.

7. The memory array of claim 1, further comprising:
    a first memory array comprising:
        the first memory column; and
        the second memory column;
    a second memory array comprising:
        a third memory column comprising:
            the third bit line;
            a third word line; and
            a fourth bit line; and
        a fourth memory column comprising:
            the fourth bit line;
            a fourth word line; and
            a fifth bit line,
    wherein the first memory array and the second memory array are configured to share the third bit line, and the third memory column and the fourth memory column are configured to share the fourth bit line, the shared third bit line facilitates sharing of one or more other memory array components between the second memory column and the third memory column, and the shared fourth bit line facilitates sharing of one or more additional memory array components between the third memory column and the fourth memory column.

8. The memory array of claim 7, wherein
    the second bit line and the third bit line are in a third plane,
    at least a portion of a continuous path of the third word line and at least a portion of a continuous path of the fourth word line are in a fourth plane, and
    the third plane intersects the fourth plane.

9. The memory array of claim 8, wherein the fourth plane is substantially orthogonal to the third plane.

10. A memory array comprising:
a first memory column comprising:
a first bit line;
a first word line; and
a second bit line; and
a second memory column comprising:
the second bit line;
a second word line; and
a third bit line,
wherein,
the first memory column and the second memory column are configured to share the second bit line and the shared second bit line facilitates sharing of one or more memory array components between the first memory column and the second memory column,
the first bit line and the second bit line are in a first plane,
at least a portion of a continuous path of the first word line and at least a portion of a continuous path of the second word line are in a second plane, and the second plane intersects the first plane, and
the memory array further comprises one or more bit line switches associated with each bit line and an amount of the bit line switches is equal to N+1, where N is an amount of memory columns.

11. The memory array of claim 10, wherein the second plane is substantially orthogonal to the first plane.

12. The memory array of claim 11, wherein the first word line and the second word line are substantially orthogonal to the first plane.

13. The memory array of claim 10, wherein the first memory column and the second memory column are configured to be arranged in a three dimensional array.

14. The memory array of claim 10, wherein the one or more memory array components comprise a bit line precharge node and a Y-directional decoder output.

15. The memory array of claim 10, comprising:
a first memory array comprising:
the first memory column; and
the second memory column;
a second memory array comprising:
a third memory column comprising:
the third bit line;
a third word line; and
a fourth bit line; and
a fourth memory column comprising:
the fourth bit line;
a fourth word line; and
a fifth bit line,
wherein the first memory array and the second memory array are configured to share the third bit line, and the third memory column and the fourth memory column are configured to share the fourth bit line, the shared third bit line facilitates sharing of one or more other memory array components between the second memory column and the third memory column, and the shared fourth bit line facilitates sharing of one or more additional memory array components between the third memory column and the fourth memory column.

16. The memory array of claim 15, wherein
the second bit line and the third bit line are in a third plane,
at least a portion of a continuous path of the third word line and at least a portion of a continuous path of the fourth word line are in a fourth plane, and
the third plane intersects the fourth plane.

17. The memory array of claim 15, wherein a column pitch between the first memory column and the third memory column is equal to a width of the second memory column.

18. A memory array comprising:
a first memory column comprising:
a first bit line;
a first word line; and
a second bit line; and
a second memory column comprising:
the second bit line;
a second word line; and
a third bit line,
wherein,
the first memory column and the second memory column are configured to share the second bit line and the shared second bit line facilitates sharing of one or more memory array components between the first memory column and the second memory column,
the first bit line and the second bit line are in a first plane,
at least a portion of a continuous path of the first word line and at least a portion of a continuous path of the second word line are in a second plane, and the second plane intersects the first plane,
the memory array further comprises one or more bit line switches associated with each bit line and an amount of the bit line switches is equal to N+1, where N is an amount of memory columns, and
the memory array is in communication with Y-directional decoder output signals, an amount of Y-directional decoder output signals is equal to the amount of the bit line switches.

19. The memory array of claim 18, wherein the bit line switches are in communication with data lines and data line bars that are associated with a sense amplifier, and at least two bit line switches are in communication with a same data line that is associated with the sense amplifier.

20. The memory array of claim 19, wherein at least two bit line switches are in communication with a same data line bar that is associated with the sense amplifier.

* * * * *